United States Patent [19]

Namba et al.

[11] Patent Number: 5,759,753
[45] Date of Patent: Jun. 2, 1998

[54] PIEZOELECTRIC DEVICE AND METHOD OF MANUFACTURING THE SAME

[75] Inventors: Akihiko Namba; Tetsuyoshi Ogura; Yoshihiro Tomita, all of Osaka; Kazuo Eda, Nara, all of Japan

[73] Assignee: Matsushita Electric Industrial Co., Ltd., Japan

[21] Appl. No.: 677,548

[22] Filed: Jul. 18, 1996

[30] Foreign Application Priority Data

Jul. 19, 1995 [JP] Japan ............... 7-182468

[51] Int. Cl.[6] .............. H01L 21/20; H01L 21/76; H01L 21/302; H01L 21/463
[52] U.S. Cl. ............... 438/456; 438/458; 438/460
[58] Field of Search ............... 310/313 R, 311; 257/417; 438/456, 458, 460

[56] References Cited

U.S. PATENT DOCUMENTS

| | | | |
|---|---|---|---|
| 4,025,954 | 5/1977 | Bert | 310/311 |
| 4,803,392 | 2/1989 | Kushida et al. | 310/311 |
| 5,199,298 | 4/1993 | Ng et al. | 73/54.01 |
| 5,342,648 | 8/1994 | Mackenzie et al. | 427/126.3 |
| 5,441,803 | 8/1995 | Meissner | 428/220 |
| 5,521,454 | 5/1996 | Hattori et al. | 310/313 R |

FOREIGN PATENT DOCUMENTS

| | | |
|---|---|---|
| 0 594 117 A1 | 4/1994 | European Pat. Off. . |
| 0 616 426 A1 | 9/1994 | European Pat. Off. . |
| 0 651 449 A2 | 5/1995 | European Pat. Off. . |

Primary Examiner—Brian Dutton
Attorney, Agent, or Firm—Parkhurst & Wendel

[57] ABSTRACT

A piezoelectric device is manufactured by: (1) mirror finishing surfaces of a first substrate and a second substrate made of a piezoelectric element; (2) forming grooves on at least one of the two surfaces of the first and second substrates; (3) joining the mirror-finished surfaces of the first substrate and the second substrate; (4) applying heat to the joined substrates and bonding them; (5) forming an opening on the first substrate so that a part of the exposed areas of the second substrate is exposed through the opening; (6) forming piezoelectric devices by forming electrodes on at least one of the second substrate through the opening and a corresponding area to the exposed area on the rear side of the second substrate; and (7) dividing the bonded substrates into portions each having one of the piezoelectric devices. Through this manufacturing method, piezoelectric devices with high yield ratios and high reliability can be obtained.

11 Claims, 13 Drawing Sheets

FIG. 3R

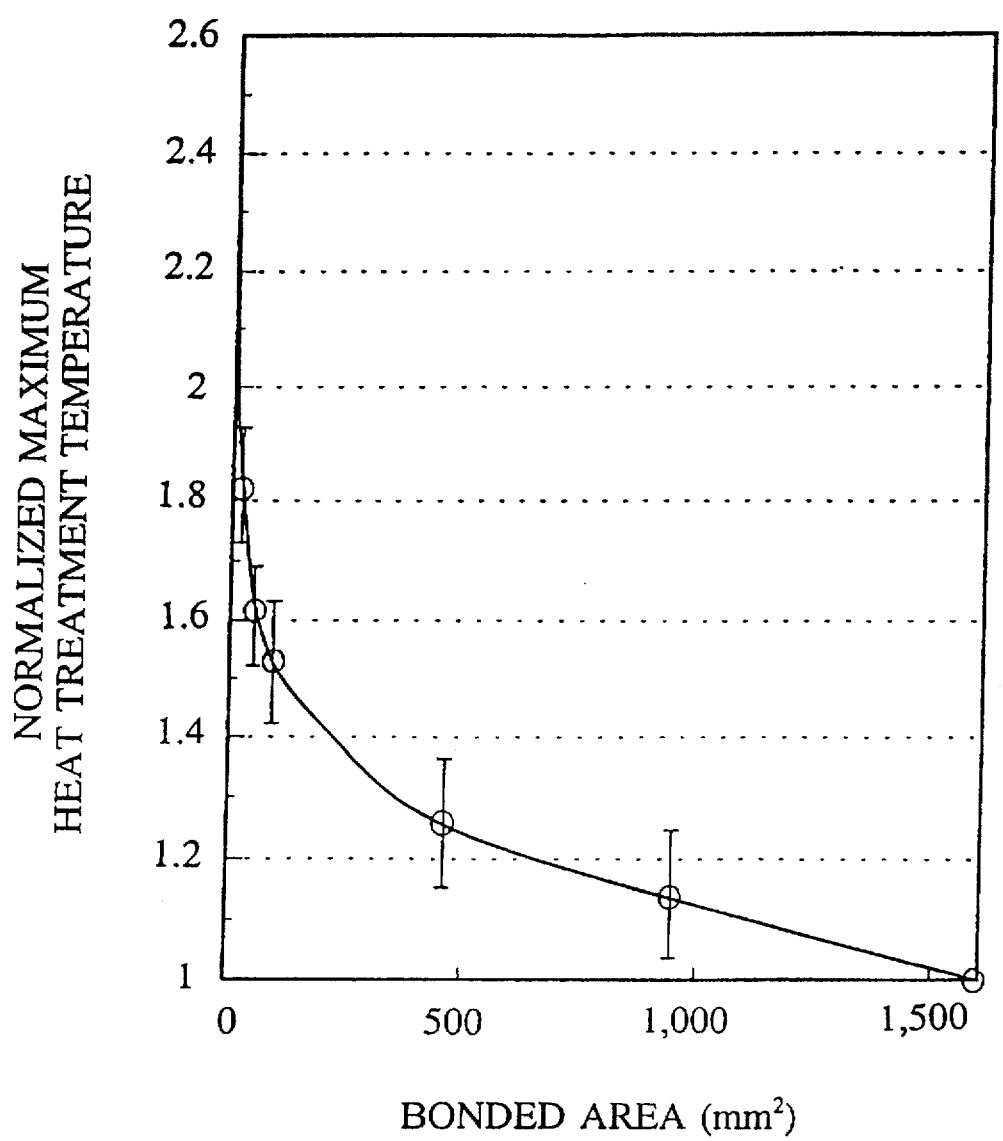

PIEZOELECTRIC DEVICE AND METHOD OF MANUFACTURING THE SAME

BACKGROUND OF THE INVENTION

The present invention relates to a piezoelectric device formed by a composite substrate which is bonded by wafer bonding or anodic bonding, and also to a manufacturing method of the piezoelectric device.

With regard to manufacturing a piezoelectric device used, for example, in a quartz oscillator, a method of bonding a piezoelectric substrate to a semiconductor substrate by wafer bonding or anodic bonding without using an intermediate adhesive layer has been recently studied. Wafer bonding is defined as a technique of joining two mirror finished substrates and applying heat thereto, thereby bonding the two substrates at an atomic level. Anodic bonding is defined as a technique of joining two mirror finished substrates and applying heat while applying a voltage to the interface between the two substrates, thereby bonding the two substrates at the atomic level.

For example, page 1045 of IEEE Ultrasonic Symposium Proceeding 1994 teaches wafer bonding of semiconductor substrates to piezoelectric devices. For example, silicon and quartz are bonded at the atomic level using a sandwiched layer of silicon dioxide therebetween. The silicon dioxide is not an intermediate adhesive layer but a product of atoms making up a silicon substrate or a quartz substrate. Another example is found in Applied Physics Letters vol. 66, page 1484 (1995). In that reference, two substrates of the same material, such as lithium niobate, are bonded by wafer bonding at the atomic level.

Wafer bonding requires, for example, the following steps:

(a) mirror finishing the bonding faces of substrates, (b) washing the substrates, (c) hydrophilically treating the substrates, if necessary, (d) joining the two substrates, and (e) applying heat and bonding the two substrates.

However, if two substrates undergoing wafer bonding or anodic bonding have different thermal expansion rates, e.g. quartz and silicon in the manufacturing of a quartz oscillator, the substrates may, due to the different thermal expansion rates, break or delaminate in step (e) when heat is applied. Japanese laid-open patent application H5-327383 discloses that a close relationship exists between the thickness of a substrate and damage or delamination thereof, when two substrates, having different thermal expansion rates, are bonded by wafer bonding or anodic bonding.

Further, damage to substrates depends on the total area bonded. A maximum heat treatment temperature (MHTT) at which no delamination occurs is defined as the temperature at which a composite substrate undergoing bonding withstands damage due to thermal stress. FIG. 11 shows that MHTT depends on the total area bonded. The horizontal axis represents a bonded area on the substrate, and the vertical axis represents normalized MHTT of the composite substrate, where a temperature value is normalized by the MHTT of 1600 mm² of bonded area.

FIG. 11 shows a curve plotted from experimental values depicting the relationship between a bonded area and MHTT, where a quartz substrate was bonded to a silicon substrate by wafer bonding through the process of hydrophilically treating, joining and heat treating. In the experiment, the quartz substrate had a thickness of 100 µm and the silicon substrate had a thickness of 600 µm. Both substrates were square. The bonding process proceeded as follows: first, the two substrates were hydrophillically treated with a mixed solution of ammonia, hydrogen peroxide, and deionized water. Second, the two substrates were joined and the temperature raised at the rate of 100° C./hour. Finally, the two substrates were held for two hours at the maximum temperature.

Since MHTT varies depending on the thickness of the substrates and the overall bonded area, it is difficult to bond two substrates of different materials by wafer bonding. Accordingly, wafer bonding has not been easy to employ in manufacturing piezoelectric devices.

MHTT is impacted by uneven distribution of thermal stresses applied to the bonded faces during the heating process. The following factors may be involved.

Bonding strength is not distributed evenly across the bonded face during the heating process. In wafer or anodic bonding, the bonding speed at the interface is not constant, that is, one area may be more strongly bonded than another. Accordingly, bonding stress is distributed unevenly in the substrate.

Also some areas may not bond altogether. That is, one area may be bonded within the substrate while another is not. Accordingly bonding stress is likewise distributed unevenly in the substrate. The following are possible reasons why some areas remain unbonded:

(a) rough surfaces, swell, warpage, and/or strains of the substrate;

(b) particles on the bonding interface;

(c) gases enclosed in the bonding interface;

(d) water molecules and atoms attached thereto enclosed at the bonding interface, when water molecules and atoms attached thereto are used for initial bonding.

An unbonded area is referred to as a void hereafter.

Sometimes piezoelectric substrates are apt to be electrically charged, which leads to particles being easily attached thereto. Such a substrate is vulnerable to damage and delamination for reason (b) set forth above. To be more specific, micron-sized particles can attach to the bonding interface, whereby voids are produced. The voids lead to extensive substrate delamination, whereby the substrate cannot be used. It is difficult to remove all of the micron-sized particles from the insulated and charged substrate, and if additional removal means is added, the washing process can become complex. When insulated substrates having anisotropic thermal expansion rates are used, the orientations of such substrates should be precisely matched. If not, damage and delamination due to stress will result.

The problems associated with conventional heat treatments in the bonding process are described above. These same problems are found in the manufacturing of piezoelectric devices. That is, when a piezoelectric device undergoes a heat-applying-process such as soldering reflow for the piezoelectric device to contact an outer electrode, the same phenomenon is observed, and piezoelectric composite substrates are delaminated. Even if voids in the bonding interface do not damage the substrates, the voids still apply stresses to piezoelectric devices formed on the piezoelectric composite substrates, thereby changing the characteristics thereof. Moreover, the voids may lead to a decrease in the reliability of the piezoelectric devices.

SUMMARY OF THE INVENTION

An object of the present invention is to prevent the problem of delamination in composite substrates by forming grooves on at least one of the substrates to be bonded by wafer bonding. Another object of the present invention is to lower the stresses applied to piezoelectric devices so that highly reliable piezoelectric devices can be produced.

The present invention relates to a manufacturing method for a piezoelectric device comprising the steps of (1) mirror finishing a principal surface of a first substrate and the counterpart of a second substrate made of piezoelectric material, (2) forming a plurality of grooves on at least one of the principal surfaces, (3) joining the principal surfaces of the first and second substrates, (4) applying heat to the joined substrates and bonding them, (5) forming an opening on the first substrate in order to expose a part of the second substrate, (6) forming a plurality of piezoelectric devices by forming an electrode on the exposed area of the second substrate through the opening and/or on the corresponding area of a rear surface of the second substrate, and (7) dividing the bonded substrates into the number of the piezoelectric devices formed thereon.

According to the manufacturing method for a piezoelectric device of the present invention, thermal stress applied to a bonding interface can be reduced by the plurality of grooves formed on the substrate. The thermal stress of the bonding interface is concentrated on the grooves, whereby application of excessive thermal stress to the bonding interface is restrained. In manufacturing a piezoelectric device by wafer bonding, the substrates will accordingly not be delaminated, and the device can be manufactured with ease.

Also, when stress is applied to a particular area on the substrate, delamination is restrained to a limited area by the grooves formed on the substrate, and the substrate will not be delaminated outside of this area. The present invention thus can realize a highly productive manufacturing method having a high yield ratio for piezoelectric devices.

The piezoelectric device disclosed in the present invention also has at least one novel hollow (in addition to the grooves) on the substrate where a piezoelectric element is formed so that an electrode can be formed on the substrate.

Piezoelectric devices manufactured according to the present invention have characteristics which are thus not, to a great extent, influenced by thermal stress.

BRIEF DESCRIPTION OF THE DRAWINGS

FIG. 11 depicts the relationship between the bonding area and maximum heat treatment temperature of the conventional composite substrate.

DETAIL DESCRIPTION OF THE INVENTION

Embodiment 1

Figure 1A:
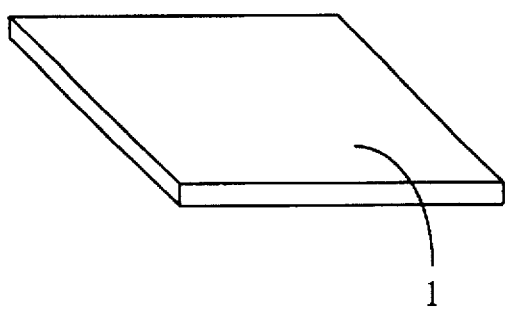
FIGS. 1(A)–1(N) depict the manufacturing method for a piezoelectric device according to embodiment 1 of the present invention.
Figure 1B:
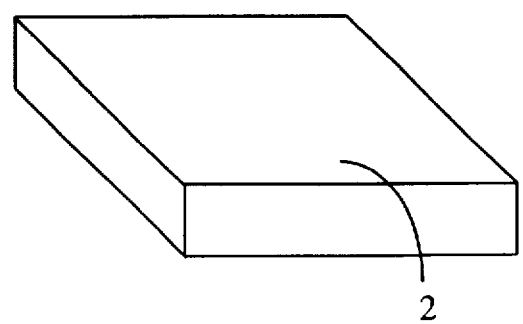
Figure 1C:
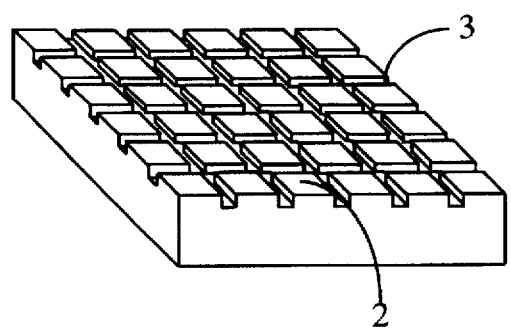
Figure 1D:
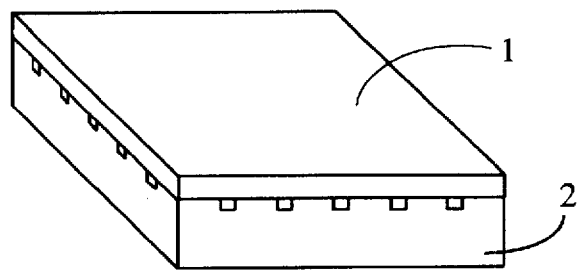
Figure 1E:
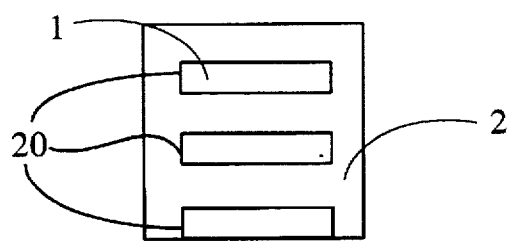
Figure 1F:
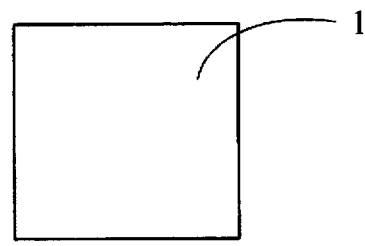
Figure 1G:
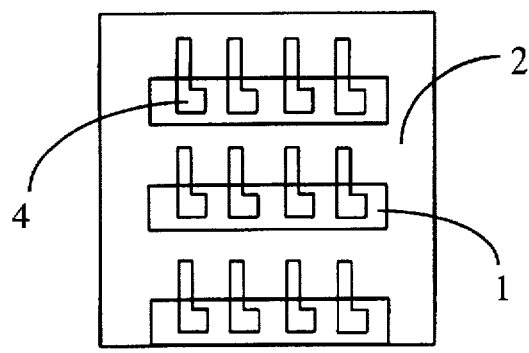
Figure 1H:
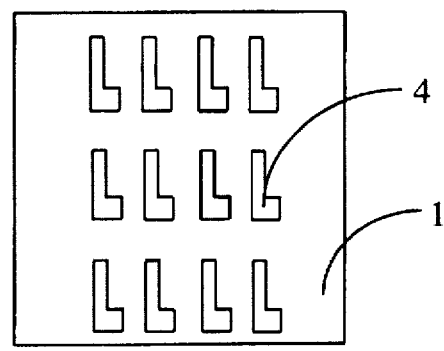
Figure 1I:
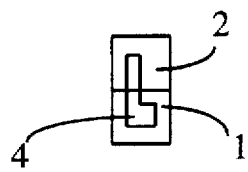
Figure 1J:
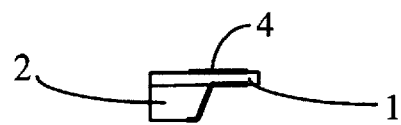
Figure 1K:
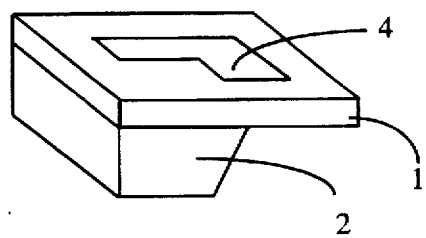
Figure 1L:
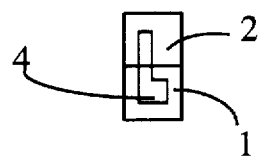
Figure 1M:
Figure 1N:
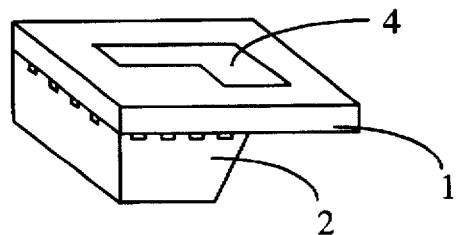

The manufacturing method for a piezoelectric device according to embodiment 1 of the present invention is described with reference to FIGS. 1(A)–1(N). A piezoelectric substrate 1 is made of 40×40 mm, 100 μm thick AT-cut quartz, and a semiconductor substrate 2 is made of 40×40 mm, 600 μm thick silicon.

The manufacturing steps are as follows:

(A) Mirror finish the surfaces of the AT-cut quartz substrate 1 and the silicon substrate 2, and wash them. Remove a surface layer with an etching solution in a hydrofluoric-acid-system. The AT-cut quartz substrate 1 is then sliced into a thin board having a specified thickness, e.g. 100 μm. See FIG. 1(A) and FIG. 1(B).

(B) Form grooves 3 on the mirror finished surface of silicon substrate 2 by etching. See FIG. 1(C). Preferable dimensions of the grooves are 100 μm in width, 30 μm in depth, and 2 mm pitch. The grooves may be substrate 2, or on both substrates 1, 2.

Considering the materials used in this embodiment, the width of the grooves should preferably be greater than the groove pitch. However, in order to obtain the desired bonding strength, the width should be no more than 90% of groove pitch. In this embodiment, the width is 5% of groove pitch. The groove depth should be limited such that the strength of the substrate having grooves thereon is not weakened. In general, a depth leaving not less than 50 μm thickness of the substrate is recommended. Thus, in the case of a 600 μm thick silicon substrate, a groove depth should be not more than 550 μm. Considering the strength of piezoelectric composite substrates, not more than a 500 μm groove depth is recommended. This embodiment employs a substrate 600 μm thick with a 30 μm groove depth, leaving a 570 μm thickness.

(C) Soak the AT-cut quartz substrate 1 and silicon substrate 2 in a mixed solution of ammonia, hydrogen peroxide and deionized water to make the surfaces hydrophilic, then wash the two substrates completely with deionized water. As a result of this process, each surface becomes hydrophilic, and water molecules and atoms attached thereto are adhered to the surfaces. Then, join the mirror ground surfaces of the two substrates whereby the two are adhered to each other by Van der Waals force as a result the water molecules and atoms attached thereto. See FIG. 1(D). If the two substrates 1, 2 are dried after the hydrophilic treatment, the same effect can be obtained.

(D) Apply heat to the two substrates 1, 2. The heat temperature, in general, ranges from room temperature to 573° C., and preferably ranges from 100° C. to 500° C. This embodiment employs a heat treatment of 240° C. for 5 hours. As a result, the two substrates are bonded through adhesion caused by atomic bonding or molecular bonding.

Adhesion due to atomic bonding means that the atoms making up the substrate surfaces directly bond with each other without an intermediate adhesive layer such as glue.

For example, atomic bonding can be used with sioloxane bonding (Si—O—Si) in bonding between silicon substrates and quartz substrates, or in bonding silicon substrates with each other.

Adhesion due to molecular bonding means that molecules or functional groups intentionally attached to the substrate surfaces bond the substrates. That is, the molecules or the functional groups do not include the atoms making up the substrate surface. A hydrogen bond by hydroxyl groups bonding with each other on hydrophilic surfaces, and a hydrogen bond by residual-water-molecules and the atoms attached thereto on the bonding interface are examples of molecular bonding. These substrate bonding types depend on the bonding temperature. The relationship between the heat treatment temperature and the bonding type varies according to the type of substrates and bond condition. However, in general, as the bonding temperature rises, the bonding types change from molecular bonding, to an intermediate type of bonding wherein both molecular and atomic bonding exist, and finally to atomic bonding. The present invention employs wafer bonding or anodic bonding, which includes all the above three types.

The manufacturing process continues as follows:

(E) Etch the silicon substrate down to the quartz substrate thus forming openings 20. FIG. 1(E) is a view from the side of substrate 2, and FIG. 1(F) is a view from the side of substrate 1.

(F) Form an electrode 4 on AT-cut quartz substrate 1. In the case of a quartz oscillator, the electrodes are formed on both faces of the quartz substrate 1 to make excitation electrodes. See FIGS. 1(G)(a) and 1(H).

(G) Dice the composite substrate along the plurality of grooves 3. If the dimension and shape of the grooves are properly selected, the substrate can be split into small pieces without dicing. For example, an outside mechanical force can warp the substrate, thereby splitting the substrate along the grooves. See FIGS. 1(I)–1(K), which show bottom, side and perspective views of a single diced piece. It is not necessary to dice the composite substrate along all of the grooves, since, the substrate may be diced into a piece including a plurality of grooves 3 between the substrates 1, 2. FIGS. 1(L)–1(N) show the same views as FIGS. 1(I)–1(K). The piezoelectric device manufactured according to the process above is finally coupled with an outer driving IC, e.g. an oscillating IC, by wire-bonding and is incorporated into an electrical apparatus.

The above manufacturing method produced the following effects:

(1) during the thermal treatment process, the grooves ease the concentration of localized thermal stress;

(2) the number of voids produced during the thermal treatment is reduced; and (3) delamination of the substrates during or after the bonding process is reduced.

Regarding item (1) above, when bonding substrates having no grooves, thermal stress due to different thermal expansion rates is applied irregularly to a bonding interface. Excess thermal stress on a local spot causes damage, and consequently delamination of the substrate. When employing the manufacturing method of this embodiment, thermal stress is concentrated around the grooves. However, since the grooves are provided at regular pitch, excess thermal stress is not experienced.

Regarding item (2) above, gases, water molecules, and atoms attached to the water molecules at the bonding interface are released via the grooves during the bonding process, thereby reducing the number of voids produced. The voids resulting from swelling and warping of the substrate are absorbed by the grooves and voids existing at the bonded area are reduced. Substrates mirror ground to as fine as several hundred microns, are particularly vulnerable to swells and warpages. When using a lot of water molecules and atoms attached thereto as bonding materials in the initial bonding, the bonding materials and particles at the bonding interface can be removed through the manufacturing method. Thus, a clean room environment is not necessary for either wafer bonding or anodic bonding.

Regarding item (3) above, when voids exist at the bonding interface, delamination of the substrates typically starts from that point, particularly during the heat treatment. However, the progress of delamination is halted at the grooves, thereby drastically reducing delamination. Furthermore, delamination occurring after the bonding process can also be reduced.

The above described manufacturing method can reduce the damages and delamination of substrates having different thermal expansion rates when they are bonded with each other by wafer bonding. The manufacturing method also improves the productivity and yield ratio of the piezoelectric devices formed on the composite substrates comprising more than two kinds of substrates. Moreover, the structure, having grooves, possibly eliminates the dicing process.

Figure 2:
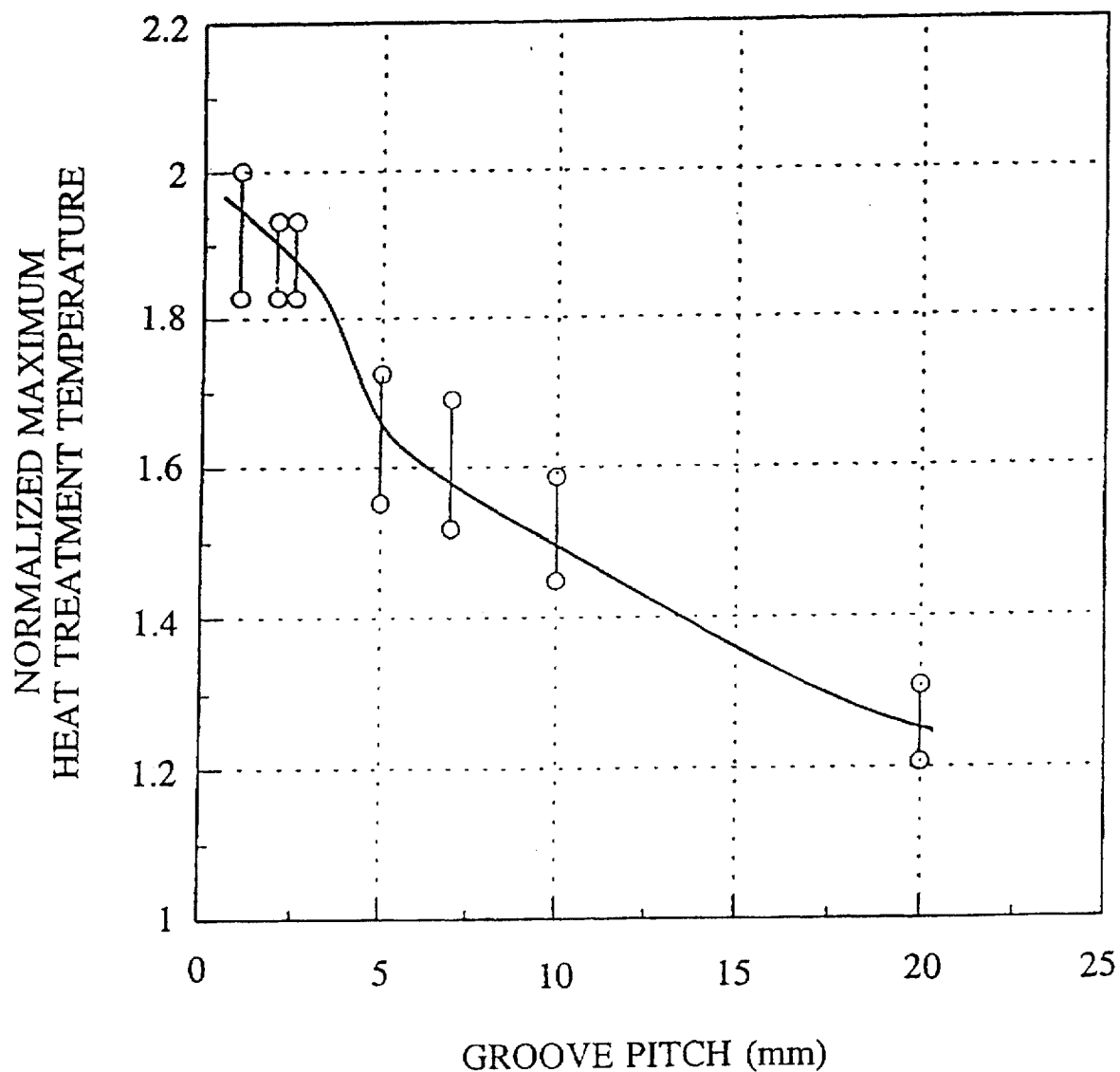
FIG. 2 depicts the relationship between groove pitch and maximum heat treatment temperature of the joined composite substrate in embodiment 1 of the present invention.

In this embodiment, composite substrates are manufactured with various groove pitches ranging from 0.3 to 20 mm. FIG. 2 depicts the relationship between the groove pitch and MHTT. The X-axis represents the groove pitch, and the Y-axis represents normalized MHTT (the maximum heat treatment temperature at which no delamination occurs normalized by another MHTT used in conventional bonding method not employing grooves.) FIG. 2 shows that MHTT in this embodiment is higher than that of the conventional method and bonding is more stable.

FIG. 2 also shows that the narrower the groove pitch becomes, the higher MHTT is, and thus bonding strength per unit area also becomes greater. The groove pitch may be set in accordance with a required bonding strength of substrates and the required dimension of a composite substrate.

The grooves on the composite substrate need not always be straight lines, nor be rectangular with vertical and horizontal lines with respect to the substrate, nor be evenly spaced. The grooves may be drawn at a slant or circularly on the substrate, all of which produce the same effect.

When an oscillating circuit is incorporated into the silicon substrate beforehand, an outside IC can be integrated within the piezoelectric device, and an apparatus of smaller size and lower cost can be obtained.

In this embodiment, the silicon substrate represents the semiconductor substrate. However, gallium arsenide, or indium phosphate substrates can also be used to produce the same effect. These compound semiconductor substrates can be used in high frequency devices, optical devices, or similar devices.

As a piezoelectric element, the following materials are confirmed to produce the same effect: quartz, lithium niobate, lithium tantalate, and PLZT (metal oxide made of PbZrO3 and PbTiO3, including an additive of La). These piezoelectric elements can be combined with semiconductors to be used in a piezoelectric oscillator, surface acoustic wave convolver, or similar device.

Embodiment 2

A glass substrate is used instead of the semiconductor substrate 2. The same manufacturing process of embodiment 1 is used for embodiment 2. A AT-cut quartz 40×40 mm, 100

μm piezoelectric substrate and a 40×40 mm, 500 μm glass substrate are used. The glass substrate has a thermal expansion rate of $3\times10^{-6}/°C$.

A manufacturing process for this embodiment is as follows:

(A) Mirror finish the surface of AT-cut quartz substrate 1 and wash it. Remove a surface layer using an etching solution in a hydrofluoric-acid-system. The AT-cut quartz substrate is sliced into a thin board having a specified thickness, e.g. 100 μm. The glass substrate is ground to a minor finish.

(B) Form grooves on the mirror finished surface of the glass substrate by etching. Dimensions of the grooves are preferably 100 μm in width, 30 mm in depth, and 2 mm in pitch. The grooves may be formed either on the AT-cut quartz substrate 1 or glass substrate 2, or on both substrates.

A bonded substrate in this embodiment is manufactured by joining the mirror finished surfaces, and then, applying the heat treatment. The heat treatment temperature may range from room temperature to no more than 573° C. when the subject materials are quartz and glass, and preferably from 100° C. to 500° C. In this embodiment, 300° C. and 180° C. are used in the heat treatment. The heat treatment is applied for five hours.

(C) Soak the AT-cut quartz substrate 1 and glass substrate 2 in a mixed solution of ammonia, hydrogen peroxide and deionized water to make the surfaces hydrophilic, then wash the two substrates completely with deionized water. As a result of this process, each surface becomes hydrophilic, and water molecules and atoms attached thereto are adhered to the surfaces. Then join the mirror ground surfaces of the two substrates and the two are adhered to each other by Van der Waals force derived from the water molecules and the atoms adhered thereto. If the two substrates 1, 2 are dried after hydrophilic treatment, the same effect can be obtained.

(D) Apply heat to the two substrates. The heat temperature, in general, ranges from room temperature to 573° C., and preferably ranges from 100° to 500° C. This embodiment employs a heat treatment of 260° C. for 5 hours.

(E) Etch the silicon substrate down to the quartz substrate 1 to form an opening.

(F) Form an electrode 4 on AT-cut quartz substrate 1. In the case of a quartz oscillator, the electrodes 4 can be formed on both faces of quartz substrate for excitation electrodes.

(G) Dice the composite substrate along the plurality of grooves. If the dimension and shape of the grooves are properly selected, the composite substrate can be split into small pieces without dicing as explained earlier with regard to embodiment 1.

The manufacturing method according to this embodiment produces the following effects. The surface of the glass substrate is typically vulnerable to swelling due to its manufacturing method, and when the surface is ground in order to remove the swelling, the surface is still vulnerable to voids because of bubbles in the substrate. This problem is solved however, by the advantages described in embodiment 1. Glass is inexpensive and has many types, thus an appropriate glass can be selected in order to match the thermal expansion rate with another substrate. The glass substrate is accordingly a good material for bonded composite substrates.

The above explained structure of the composite substrate which comprises the glass substrate 2 and another substrate having a different thermal expansion rate from the glass substrate, can raise the maximum temperature at which no damage to the composite substrate occurs. Furthermore age-variation is better controlled which results in improved reliability of the composite substrates.

When using other glass substrates of different thermal expansion rates, heat treatments at higher temperatures than those for composite substrates having no grooves can be applied, by selecting a suitable groove pitch, and groove depth commensurate with the heat expansion rate. For example, glass substrates for which heat expansion rates are $3\times10^{-6}/°C$, $7\times10^{-6}/°C$, $14\times10^{-6}/°C$, and $15\times10^{-6}/°C$. are used for manufacturing the bonded composite substrate according to this embodiment to produce the same effect as described above.

The grooves on the composite substrate need not always be straight lines, nor be rectangular with vertical and horizontal lines on the substrate, nor be evenly spaced. The grooves may be drawn at a slant or circularly on the substrate, all of which produce the same effect.

Instead of a quartz substrate used as the piezoelectric element, the following materials have been confirmed to produce the same effect: lithium niobate, lithium tantalate, and PLZT (metal oxide made of $PbZrO3$ and $PbTiO3$, including an additive of La). Also, instead of a piezoelectric element, a semiconductor substrate made of silicon, gallium arsenide, or indium phosphide can be used, and all produce the same effect.

When an oscillating circuit comprising a thin-film transistor, for example, is incorporated into the glass substrate beforehand, an outside IC can be integrated within the piezoelectric device, and an apparatus of smaller size and lower cost can be obtained.

Embodiment 3

Figure 3A:
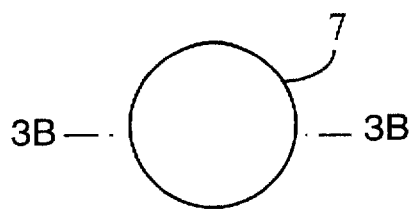
FIGS. 3(A)–3(V) depict the manufacturing method for a piezoelectric device according to embodiment 3 of the present invention.
Figure 3C:
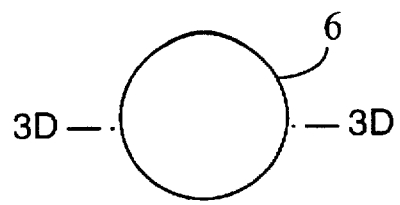
Figure 3B:
Figure 3D:
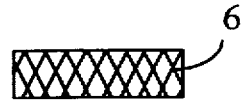
Figure 3E:
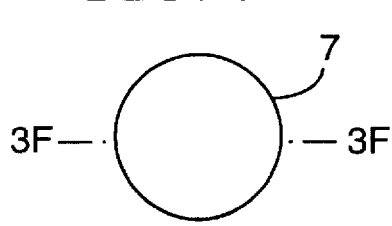
Figure 3G:
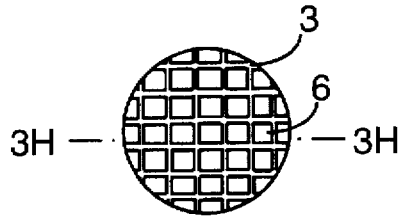
Figure 3F:
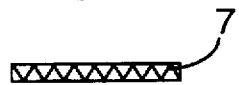
Figure 3H:
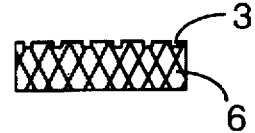
Figure 3I:
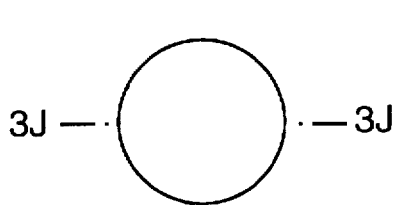
Figure 3K:
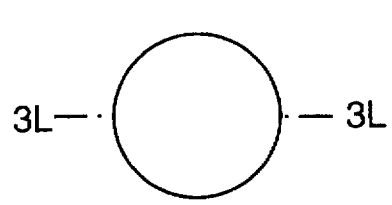
Figure 3J:
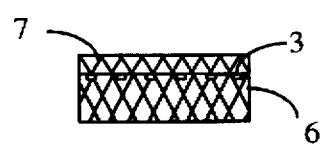
Figure 3L:
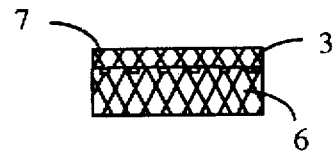
Figure 3M:
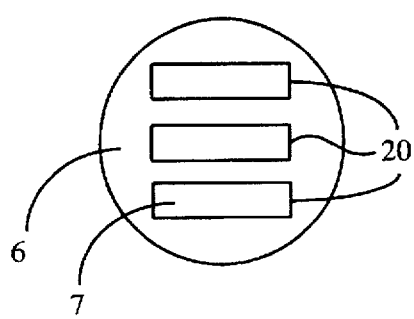
Figure 3N:
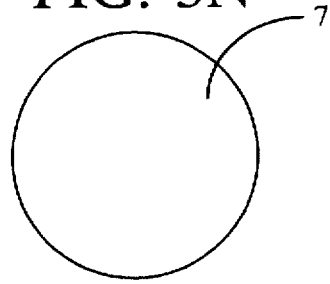
Figure 3O:
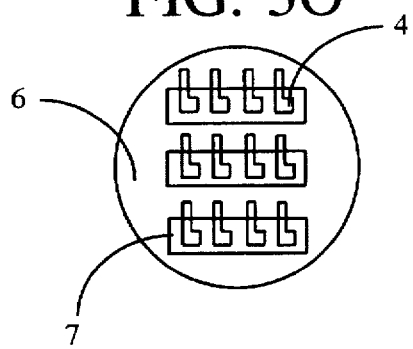
Figure 3P:
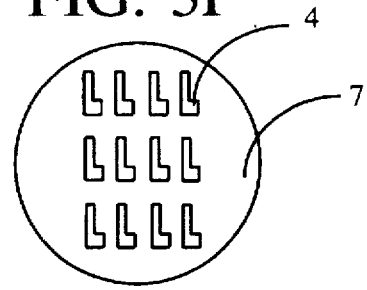
Figure 3Q:
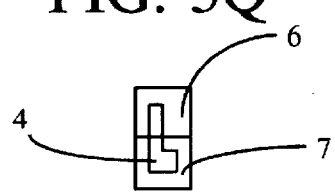
Figure 3S:
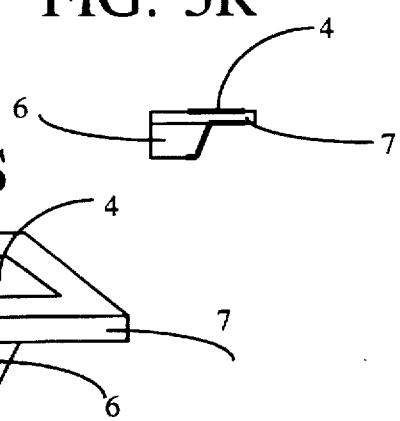
Figure 3T:
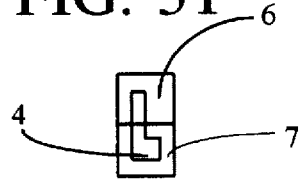
Figure 3U:
Figure 3V:
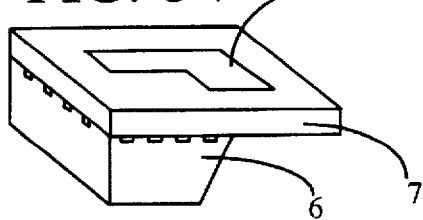

FIGS. 3(A)–(V) depict a third embodiment of the piezoelectric device manufacturing method according to the present invention. A substrate of lithium niobate is used in this embodiment. FIGS. 3(A), 3(C), 3(I) and 3(K) through are top views, and the remaining drawings are (b) is a cross sections as indicated. A piezoelectric substrate 7 comprises a 128° rotated, y-cut, 100 μm thick lithium niobate, for example, 51 mm in diameter. A piezoelectric substrate 6 comprises a wafer, e.g. 51 mm in diameter, and made of 500 μm thick y-cut lithium niobate. The manufacturing process is explained below.

(A) Mirror grind the surface of the lithium niobate substrate, and wash the surface. Remove a surface layer using an etching solution in a hydrofluoric-acid-system. The y-cut lithium niobate substrate 7 is sliced into a thin board having a specified thickness, e.g. 50 μm. See FIG. 3(A).

(B) Form grooves on the mirror ground surface of the y-cut 500 μm thick lithium niobate substrate by etching. See FIGS. 3(G) and (3H). The groove dimensions are preferably 500 μm in wide, 30 μm in deep and 10 mm in pitch. The grooves may be formed either on the 50 μm thick y-cut lithium niobate substrate or both on the 500 μm y-cut lithium niobate substrate and the 50 μm thick y-cut lithium niobate substrate.

(C) Soak the y-cut lithium niobate substrates in a mixed solution of ammonia, hydrogen peroxide and deionized water to make the surfaces hydrophilic, then wash the substrates completely with deionized water. As a result of this process, each surface becomes hydrophilic, and water molecules and atoms attached thereto are adhered to the surfaces. Then join the mirror ground surfaces of the two substrates whereby the two are adhered to each other by Van der Waals force as a result of the water molecules and the atoms adhered thereto. See FIGS. 3(I)–3(L). If the two substrates are dried after hydrophilically treating, the same effect can nevertheless be obtained.

(D) Apply heat to the two substrates. The temperature, in general, ranges from room temperature to 1100° C., and preferably ranges from 100° C. to 1100° C. This embodiment employs a heat treatment of 800° C. for 5 hours.

(E) Etch the lithium niobate substrate 6 down to the piezoelectric substrate 7, and form an opening. See FIGS. 3(M) and (N), where FIG. 3(M) is a view from the substrate 6 side and FIG. 3(N) is a view from the substrate 7 side.

(F) Form an electrode 4 on the piezoelectric substrate. In the case of an oscillator, electrodes 4 are formed on both faces of the substrate to form excitation electrodes. See FIGS. 3(O) and 3(P).

(G) Dice the composite substrate along the plurality of grooves. See FIGS. 3(G)(a)–3(G)(c), which show bottom, side and perspective views of a single diced piece. If the dimension and shape of the grooves are properly selected, the substrate can be split into small pieces without dicing as explained in embodiment 1. The device shown in FIGS. 3(I)–3(V) is similar to the device shown in FIGS. 1(L)–1(N), with respect to the grooves between substrates 6 and 7.

The piezoelectric device manufactured according to the above process is finally coupled with an outer driving IC, e.g. an oscillating IC, by wire-bonding and is incorporated into an electrical apparatus.

The manufacturing method according to this embodiment produces the same effects as those noted in embodiment 1, namely:

(1) during the thermal treatment process, the grooves ease the concentration of localized thermal stress;

(2) the number of voids produced during the heat treatment process is reduced; and (3) delamination of the substrates during or after the bonding process is reduced.

The effects obtained in this embodiment are the same as those of the previous embodiments. Since an insulated substrate is vulnerable to being charged, effect (3) above, is rather remarkable. Furthermore, effect (1) is also observed with composite bonded substrates having anisotropic thermal extension rates, even when orientations of the substrates are shifted at bonding.

Through the manufacturing method explained above, the productivity and yield ratio of the composite substrates made of insulated substrates having the same thermal expansion rate can be improved.

As a piezoelectric element, other materials can be used instead of lithium niobate such as lithium tantalate or PLZT (metal oxide made of PbZrO3 and PbTiO3, including an additive of La).

As long as the materials can be mirror ground, other materials with different cut-angles can be used as the piezoelectric substrate to meet a particular application.

Since in the prior art voids often appeared in mirror-ground piezoelectric elements during manufacturing, the above mentioned effects are clear improvements over the prior art.

The above explained structure of the composite substrates comprising a piezoelectric substrate and another piezoelectric substrate having different thermal expansion rates allows an increase in the maximum temperature at which no damage to the composite substrate occurs. Furthermore age-variation is constrained thereby resulting in improved reliability of the composite substrates.

The grooves on the composite substrate of this embodiment need not always be straight lines, nor be vertical and horizontal lines, nor be evenly spaced as explained with regard to the previous embodiments.

Finally, a composite substrate comprising different kinds of substrates bonded together has different characteristics from that of the original substrates themselves.

Embodiment 4

FIGS. 3(A)–3(V) also depicts a fourth embodiment of the manufacturing method for a piezoelectric device according to the present invention.

In this embodiment, substrates having the same crystal orientation are employed. This is different from embodiment 3 above.

A piezoelectric substrate 7 is, for example, a wafer 51 mm in diameter, 50 μm thick, y-cut lithium niobate. A piezoelectric substrate 6 is, for example, a wafer 51 mm in diameter, 500 μm thick and made of y-cut lithium niobate. The bonding interface between these two bonded substrates has grooves 3. In this embodiment, the grooves 3 are provided on the piezoelectric substrate 6 both in horizontal and vertical directions. The dimensions of groove 3 are 500 μm in width, 30 μm in depth, and 5 in mm pitch (the distance between adjacent groove centers). Considering the materials used in this embodiment, groove width, in general, may be greater than the groove pitch. However, in order to achieve enough bonding strength, the groove width is preferably less then 95% of the groove pitch. In this embodiment, the groove width is 10% of the groove pitch. The groove depth should not be so deep as to weaken the strength of the substrate. In this embodiment, the groove depth is 30 μm so that 470 μm in thickness of substrate remains of the 500 μm total thickness.

The bonded composite substrates explained in this embodiment can be manufactured by joining the mirror ground substrates and applying heat thereto. The temperatures of the heat treatment, when, for example, lithium niobate substrates are used for both substrates, may range from room temperature to 1100° C., and more preferably, from 100° C. to 1000° C. This embodiment employs a temperature of 300° C. to 500° for 5 hours.

The manufacturing method according to this embodiment produces the same effects as those noted earlier, namely:

(1) during the thermal treatment process, the grooves ease the concentration of localized thermal stress;

(2) the number of voids produced during the heat treatment process is reduced; and (3) delamination of the substrates is reduced. The effects gained in this embodiment are the same as those of embodiment 1. Since an insulated substrate is vulnerable to being charged, effect (3) seems most remarkable.

Moreover, effect (1) is achievable in composite bonded substrates having anisotropic thermal expansion rates.

The manufacturing method explained above for bonded composite substrates having the same thermal expansion rate allows the maximum temperature at which no damage to the composite substrates occurs to be raised. Moreover, age-variation is constrained, thereby resulting in improved reliability of the substrates.

As a piezoelectric element, the following materials can also be used instead of lithium niobate: quartz, lithium tantalate, or PLZT (metal oxide made of PbZrO3 and PbTiO3, including an additive of La). These materials also produce the same effects as explained above. When anisotropic materials are used, the cut-angle can be selected according to a particular application.

As explained with respect to the previous embodiment, the grooves on the composite substrates need not be in any particular geometric shape.

Finally, this embodiment is not limited to piezoelectric substrates materials. That is, the same effects can be achieved with glass substrates. Also, other materials can produce the same effects as long as they are insulated substrates, to which wafer bonding or anodic bonding can be applicable.

Embodiment 5

Figure 4A:
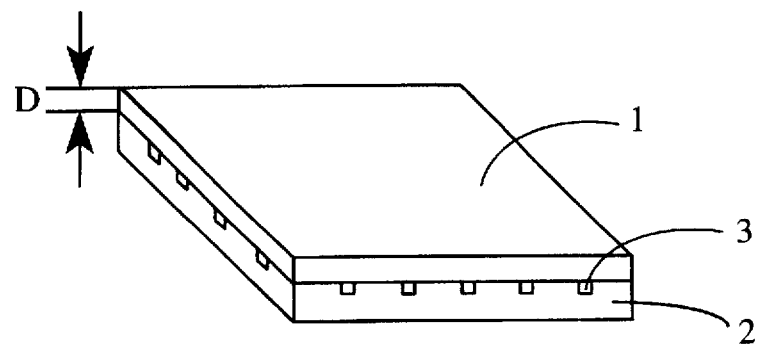
FIGS. 4(A)–4(B) depict, partially, the manufacturing method of a piezoelectric device according to embodiment 5 of the present invention.

A fifth embodiment of the invention employs the same manufacturing method as the previous embodiments, but differs in that the substrates are made into thin boards before the heat treatment. See FIG. 4(A).

Figure 4B:
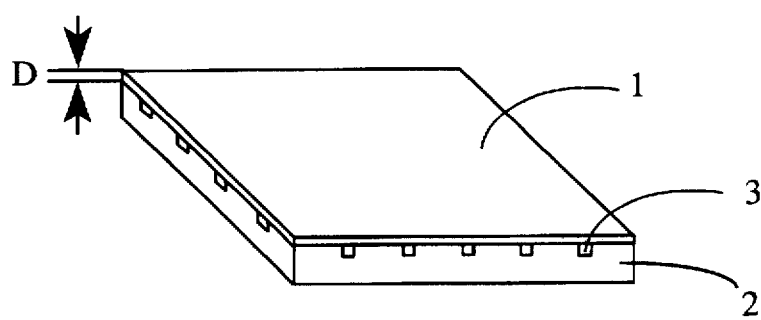

After steps (A) through (C) of embodiment 1, the substrates are temporarily bonded at a low temperature. Then, the AT-cut quartz substrate 1 is polished and etched as shown in FIG. 4B into a thin board having a thickness (D) ranging from 10 μm to 20 μm down from a thickness D of about 100 μm shown in FIG. 4(A). The process after this polishing and etching is the same as process steps (D) through (G) of embodiment 1.

This embodiment produces the following effects. The thinner the board is, the higher the MHTT (maximum heat treatment temperature) can be, thereby preventing the substrates from delaminating and further improving productivity. Also, since the present invention reduces the occurrence of voids, the substrate's thickness after grinding becomes approximately constant, that is, an entirely flat surface is achieved. Finally, the spread of performance characteristics for piezoelectric devices becomes narrower and better yield ratios can be expected.

This embodiment is explained based on embodiment 1. However, when all other embodiments employ this method, the same effects can be realized.

Embodiment 6

Figure 5:
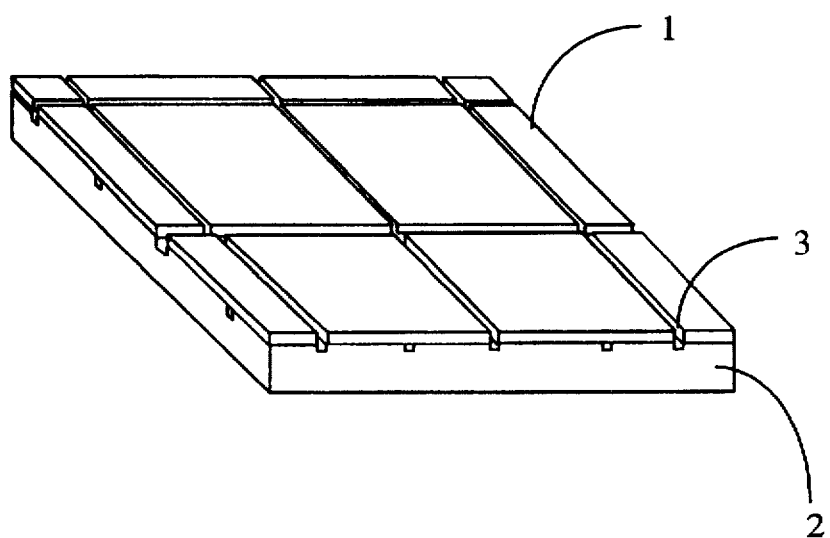
FIG. 5 depicts, partially, the manufacturing method of a piezoelectric device according to embodiment 6 of the present invention.

A sixth embodiment of the present invention is explained next. After steps (A) through (C) of embodiment 1, the substrates are temporarily bonded at a low temperature. Then, the AT-cut quartz substrate 1 is separated with a dicing saw as shown in FIG. 5. The dicing saw preferably follows along the grooves on the semiconductor substrate 2. The process after this sawing step is the same as steps (D) through (G) of embodiment 1.

Through the manufacturing method according to embodiment 6, the AT-cut quartz substrate 1 is divided into pieces, thus defects such as delamination on a part of a divided piece of the substrate does not progress to an adjacent area. Accordingly, the yield ratio of piezoelectric devices is further improved.

Instead of the dicing saw, a diamond cutter, sand blasting which grinds a subject item by blasting fine grains of grit, or etching can be used to separate the quartz substrate 1.

This embodiment is explained based on embodiment 1. However when all other embodiments employ this method, the same effects can be realized.

Embodiment 7

Figure 6A:
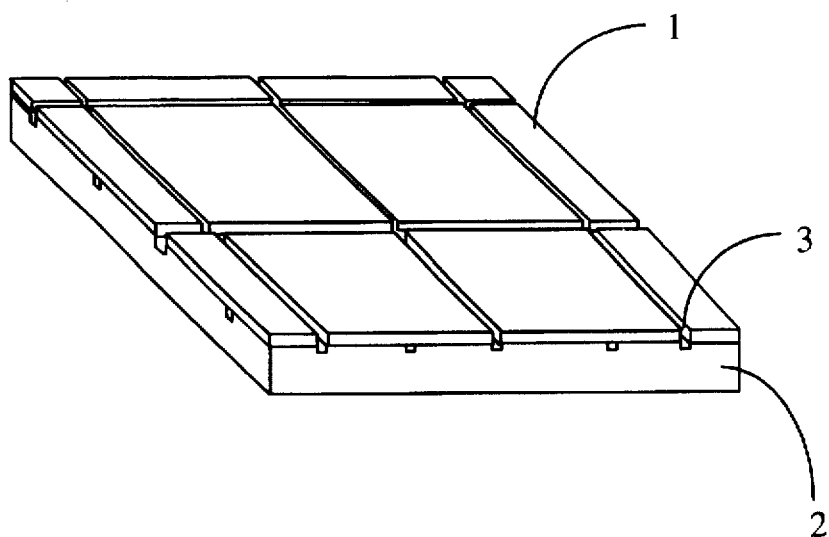
FIGS. 6(A)–6(B) depict, partially, the manufacturing method of a piezoelectric device according to embodiment 7 of the present invention.
Figure 6B:
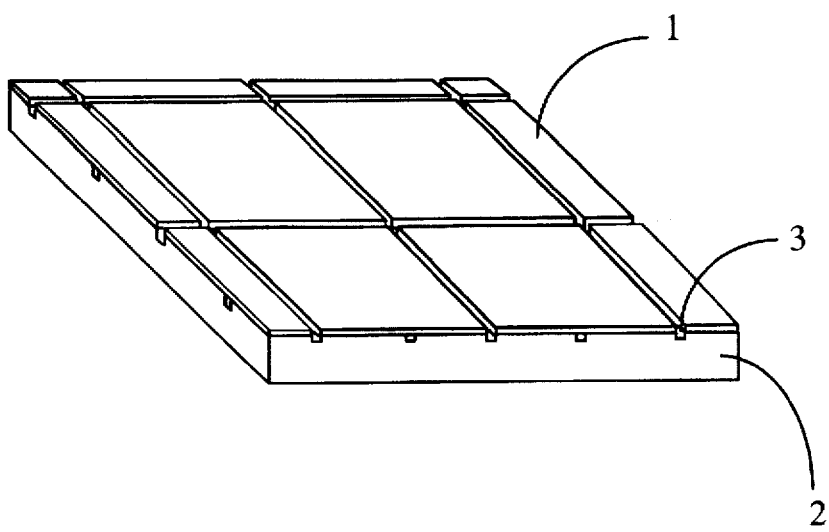

A seventh embodiment of the present invention is explained next. After steps (A) through (C) of embodiment 1, the substrates are temporarily bonded at a low temperature. Then, the following steps are added as shown in FIGS. 6(A) and 6(B).

(a) Separate the AT-cut quartz substrate 1 with the dicing saw. The dicing saw preferably follows along the grooves on the semiconductor substrate 2. See FIG. 6(A).

(b) Grind and etch the AT-cut quartz substrate 1 to 20 μm in thickness. See FIG. 6(B).

Then, steps (D) through (G) of embodiment 1 are applied for manufacturing the piezoelectric devices.

Through this manufacturing method, the same effects described in embodiment 1 are achieved, and further, the effects of embodiments 5 and 6 are also realized. When grinding the AT-cut quartz substrate 1, grit grains contact thereon entirely and evenly, thus the spread of substrate's thickness becomes narrower, and the yield ratio as well as productivity is improved.

This embodiment is explained based on embodiment 1. However, when all other embodiments employ this method, the same effects can be realized.

Embodiment 8

Figure 7:
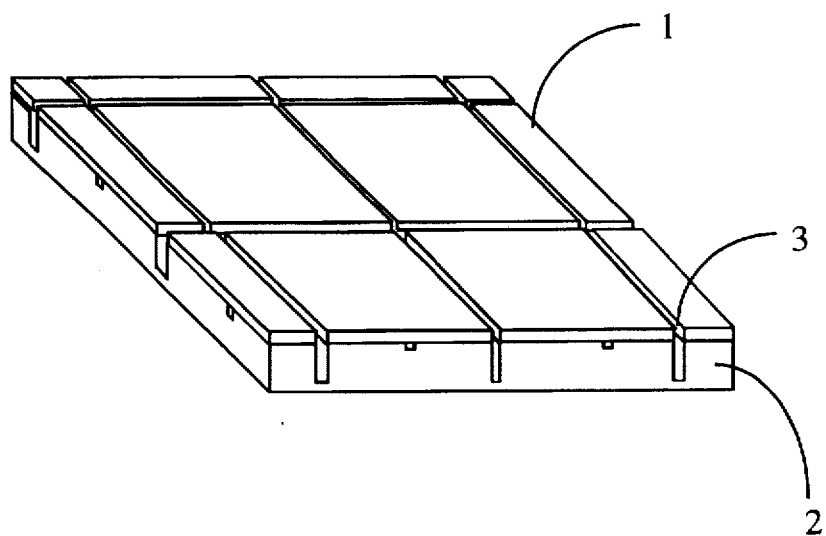
FIG. 7 depicts, partially, the manufacturing method of a piezoelectric device according to embodiment 8 of the present invention.

After steps (A) through (C) of embodiment 1, the substrates are temporarily bonded at a low temperature. Then, the bonded composite substrate is separated into small pieces with a dicing saw, as shown in FIG. 7. The dicing saw preferably follows along the grooves on the semiconductor substrate 2. After this sawing, steps (D) through (G) of embodiment 1 are applied to each small piece, and piezoelectric devices are manufactured.

Through this manufacturing method according to embodiment 8, the same effects described in the embodiment 1 are achieved, and MHTT is further raised substantially because a bonding area is smaller due to the dicing of the substrates into small pieces.

This embodiment is explained based on embodiment 1. However, when all other embodiments employ this method, the same effects can be realized.

Embodiment 9

Figure 8A:
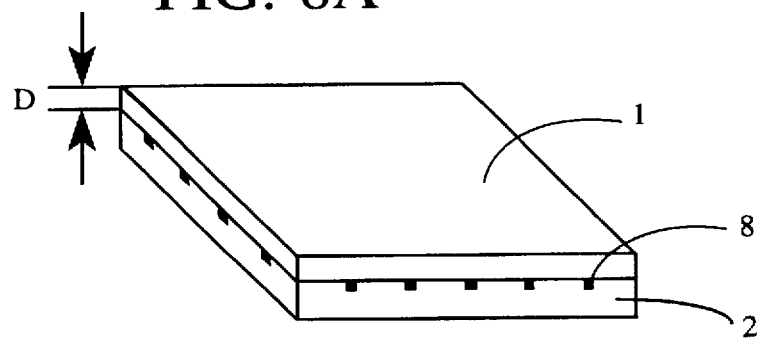
FIGS. 8(A)–8(B) depict, partially, the manufacturing method of a piezoelectric device according to embodiment 9 of the present invention.

In a ninth embodiment of the present invention, grooves 8 are filled with filler, such as electron wax. After steps (A) through (C) of embodiment 1, the substrates are temporarily bonded at a low temperature as shown in FIG. 8(A). Then, the following steps are taken:

(a) Apply heat of 70° C. to the bonded composite substrates, and inject electron wax into the grooves. The electron wax permeates into the grooves due to capillarity action.

Figure 8B:
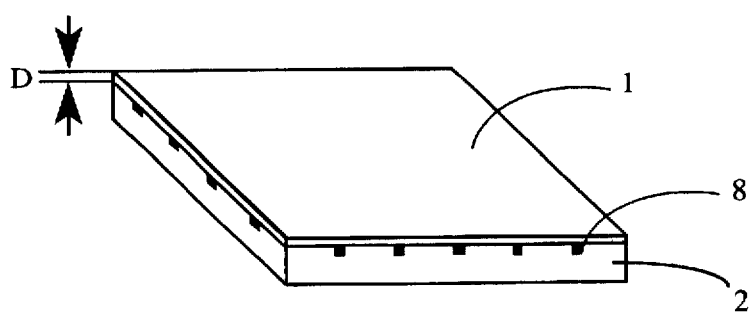

(b) Grind and etch the AT-cut quartz substrate 1 down to 20 μm. See FIGS. 8(A) and 8(B).

After process step (b), steps (D) through (G) of embodiment 1 are applied for manufacturing the piezoelectric devices.

The manufacturing method explained above strengthens the bonding and improves the yield ratio in the latter processes, although the heat treatment at lower temperature weakens the bonding strength. In other words, the electron wax injected into the grooves prevents foreign matter from invading the grooves from the sides of the substrates, particularly in the grinding & etching process.

Instead of electron wax, other materials can be used as long as they permeate into the grooves and harden at room temperature. Such materials also provide the same effect. Also, instead of a 70° C. applied temperature, any temperature at which the electron wax melts is acceptable.

This embodiment is explained based on embodiment 1. However, when all other embodiments employ this method, the same effects can be realized.

Embodiment 10

Figure 9A:
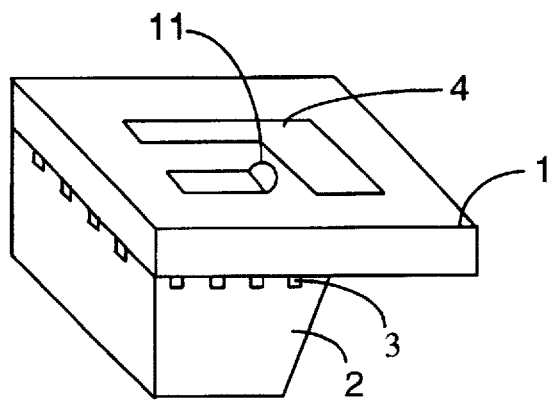
FIGS. 9(A)–9(D) depict the piezoelectric device of the present invention.
Figure 9B:
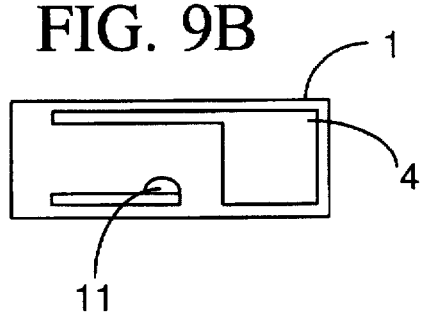
Figure 9C:
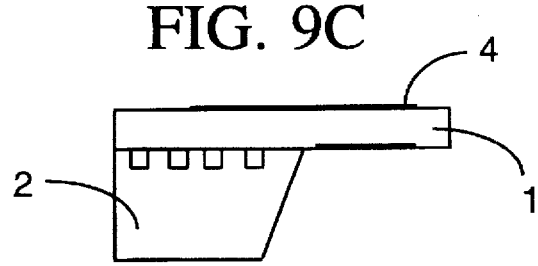
Figure 9D:
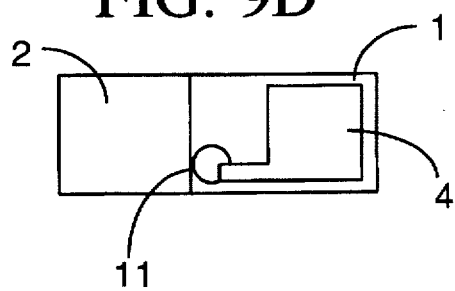

FIGS. 9(A)-(D) depict a piezoelectric device according to the present invention. FIG. 9(A) is a perspective view, FIG. 9(B) is a top view, FIG. 9(C) is a cross sectional view, and FIG. 9(D) is a rear view. A quartz substrate 1 and semiconductor substrate 2 are used. An electrode 4 comprises excitation electrodes in the case of an oscillator. A through hole 11 is formed in order to pull up the lower electrode for making the connection of the lower electrode to the outside by wire bonding. These piezoelectric devices may be used to connect with an outside driving circuit by wire bonding.

The present invention is characterized by the grooves 3 formed on the semiconductor substrate 2 for reducing localized stress applied to the bonding interface between the substrates. In FIGS. 9(A)–(D), the dimension of the bonded area is 5×5 mm, groove width is 50 μm, groove depth is 10 μm, and groove pitch is 1 mm.

The grooves prevent the substrates from delaminating in a subsequent heat applying process such as solder reflow during which thermal stress is applied to the substrates. When driving the devices, the grooves can reduce the stress from the substrates, thus highly reliable piezoelectric devices can be manufactured.

When forming an IC for a driving circuit on the semiconductor substrate 2, the size of an apparatus including the piezoelectric device can be reduced and its price can be lowered.

Considering the reduction of stress is a main objective in the present invention, the grooves formed on the semiconductor substrate may simply be hollows. In other words, whereas striped grooves achieve the desired effect, scattered hollows in the substrates provide the same effect. The substrate and piezoelectric device may be bonded at the resulting island portions. In short, as long as a non-contacting part, which moderates the stress, is formed on the substrate, the effect of the present invention can be realized.

In this embodiment, the silicon substrate represents the semiconductor substrate. However, gallium arsenide, or indium phosphate substrates can be also used to produce the same effect. The aforementioned compound semiconductor substrates can be used in high frequency devices, optical devices, or other similar devices.

As a piezoelectric element, other materials that have been confirmed to produce the same effect include: quartz, lithium niobate, lithium tantalate, and PLZT (metal oxide made of PbZrO3 and PBTiO3, including an additive of La). These piezoelectric elements can be combined with semiconductors to be used in a piezoelectric oscillator, surface acoustic wave convolver, or other similar devices.

Embodiment 11

Figure 10A:
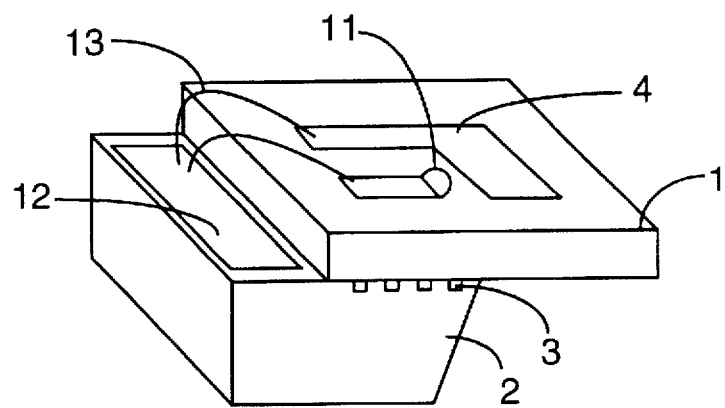
FIGS. 10(A)–10(D) depict another piezoelectric device of the present invention.
Figure 10B:
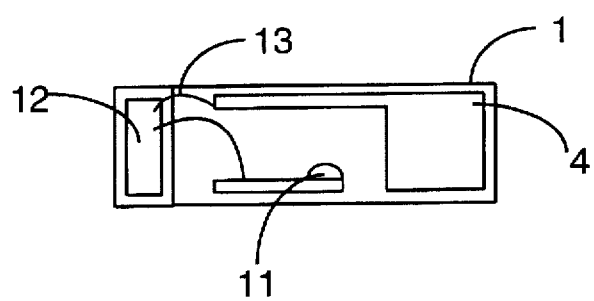
Figure 10C:
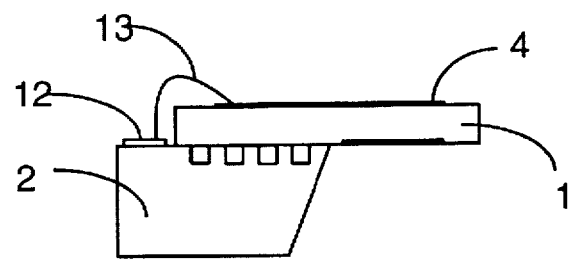
Figure 10D:
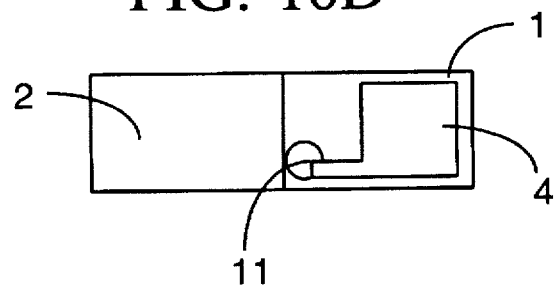

FIGS. 10(A)–(D) depict a piezoelectric device according to the present invention. FIG. 10(A) is a perspective view, FIG. 10(B) is a top view, FIG. 10(C) is a cross section, and FIG. 10(D) is a rear view. A quartz substrate 1 and semiconductor substrate 2 are used. Electrodes 4 are excitation electrodes in the case of an oscillator. A through hole 11 is formed in order to pull up the lower electrode 4 for making the connection of the lower electrode 4 to the outside by wire bonding. These piezoelectric devices may be used with an outside driving circuit by wire bonding.

In this embodiment, an IC 12 is formed for a driving circuit on the semiconductor substrate 2 so that an apparatus including the size of the piezoelectric devices can be reduced and its price can be lowered. The IC 12 is electrically connected to electrode 4 formed on the quartz substrate 1 by using metal wire 13.

A manufacturing method of this piezoelectric device is similar to the above embodiments, except with regard to the process by which IC 12 is formed on substrate 2 and through holes 11 are formed on substrate 1 for wire bonding to connect IC 12.

The present invention is characterized by grooves 3 formed on the semiconductor substrate 2 for reducing localized stress applied to the bonding interface between the substrates 1, 2. In FIGS. 10(A)–(D), the dimension of the bonded area is 5×5 mm, groove width is 50 μm, groove depth is 10 μm, and groove pitch is 1 mm.

The grooves 3 prevent the substrates from delaminating in a heat applying process such as solder reflow, wherein thermal stress is applied to the composite substrate. When driving the devices, the grooves can also reduce stress from the substrates themselves. Moreover, highly reliable piezoelectric devices can be manufactured as in earlier explained embodiments wherein scattered hollows replace striped grooves.

In this embodiment, a silicon substrate represents the semiconductor substrate. However, gallium arsenide, or indium phosphate substrates can also be used to achieve the same effect. These composite semiconductor substrates are useful in high frequency devices, optical devices, or similar devices.

As a piezoelectric element, other materials have been confirmed to produce the same effect including quartz, lithium niobate, lithium tantalate, and PLZT (metal oxide made of PbZrO3 and PbTiO3, including an additive of La). These piezoelectric elements can be combined with semiconductors to be used in a piezoelectric oscillator, surface acoustic wave convolver, or similar devices.

What is claimed is:

1. A manufacturing method for a piezoelectric device, comprising the steps of:

(1) mirror finishing principal surfaces of a first substrate and a second substrate, said second substrate comprising a piezoelectric element;

(2) forming a plurality of grooves on at least one of said principal surfaces of said first and second substrates;

(3) joining said principal surfaces of said first substrate and said second substrate;

(4) applying heat to the joined substrates and bonding the joined substrates;

(5) forming an opening in said first substrate such that an area of said second substrate is exposed through said opening;

(6) forming a plurality of piezoelectric devices by forming electrodes on the exposed area of the second substrate through said opening and on a rear side of said second substrate at an area corresponding to the exposed area; and (7) dividing the bonded substrates into portions each having one of said plurality of piezoelectric devices.

2. The manufacturing method of claim 1, wherein said first substrate comprises one of semiconductor, glass, and piezoelectric material.

3. The manufacturing method of claim 1, wherein said first substrate comprises one of silicon, gallium arsenide, and indium phosphate.

4. The manufacturing method of claim 1, wherein said first substrate further comprises a silicon substrate having an integrated circuit formed thereon.

5. The manufacturing method of claim 1, wherein said first substrate further comprises a glass substrate having an integrated circuit formed thereon.

6. The manufacturing method of claim 1, wherein said second substrate comprises one of quartz, lithium niobate, lithium tantalate, and PLZT.

7. A manufacturing method for a piezoelectric device, comprising the steps of:

(1) mirror finishing principal surfaces of a first substrate and a second substrate said second substrate comprising a piezoelectric element;

(2) forming a plurality of grooves on at least one of said principal surfaces of said first and second substrates;

(3) joining said principal surfaces of said first substrate and said second substrate;

(4) reducing the thickness of said second substrate;

(5) applying heat to the joined substrates and bonding the joined substrates;

(6) forming an opening in said first substrate such that an area of said second substrate is exposed through said opening;

(7) forming a plurality of piezoelectric devices by forming electrodes on the exposed area of said second substrate through said opening and on a rear side of said second substrate at an area corresponding to the exposed area; and (8) dividing the bonded substrates into portions each having one of said plurality of piezoelectric devices.

8. A manufacturing method for a piezoelectric device, comprising the steps of:

(1) mirror finishing principal surface of a first substrate and a second substrate, said second substrate comprising a piezoelectric element;

(2) forming a plurality of grooves on at least one of said principal surfaces of said first and second substrates;

(3) joining said principal surfaces of said first and second substrates;

(4) dividing said second substrate into a plurality of portions.

(5) applying heat to said joined substrates and bonding the joined substrates;

(6) forming an opening in said first substrate so that an area of said second substrate is exposed through said opening;

(7) forming a plurality of piezoelectric devices by forming an electrode on the exposed area of said second substrate through said opening and on a rear side of said second substrate at an area corresponding to the exposed area; and (8) dividing the bonding substrates into portions each having one of said plurality of piezoelectric devices.

9. A manufacturing method for a piezoelectric device, comprising the steps of:

(1) mirror finishing principal surfaces of a first substrate and a second substrate said second substrate comprising a piezoelectric element;

(2) forming a plurality of grooves on at least one of the principal surfaces of said first and second substrate;

(3) joining said principal surfaces of said first substrate and second substrates;

(4) reducing the thickness of said second substrate;

(5) dividing said second substrate into a plurality of areas;

(6) applying heat to the joined substrates and bonding the joined substrates;

(7) forming an opening in said first substrate such that an area of said second substrate is exposed through said opening;

(8) forming a plurality of piezoelectric devices by forming an electrode on the exposed area of said second substrate through said opening and on a rear side of said second substrate at an area corresponding to the exposed area; and (9) dividing the bonded substrates into portions each having one of said plurality of piezoelectric devices.

10. A manufacturing method for a piezoelectric device, comprising the steps of:

(1) mirror finishing principal surfaces of a first substrate and a second substrate, said second substrate comprising a piezoelectric element;

(2) forming a plurality of grooves on at least one of said principal surfaces of said first and second substrate;

(3) joining said principal surfaces of said first substrate and second substrate;

(4) dividing the joined substrates into a plurality of areas;

(5) applying heat to the joined substrates and bonding the joined substrates;

(6) forming an opening on each of the divided substrates so that a part of said second substrate is exposed through said opening; and (7) forming an electrode on at least one of the exposed parts of said second substrate through said opening and on a rear side of said second substrate at an area corresponding to the exposed area.

11. A manufacturing method for a piezoelectric device, comprising the steps of:

(1) mirror finishing principal surfaces of a first substrate and a second substrate said second substrate comprising a piezoelectric element;

(2) forming a plurality of grooves on at least one of said principal surfaces of said first and second substrates;

(3) washing said first substrate and said second substrate;

(4) joining said principal surfaces of said first substrate and second substrate;

(5) filling said grooves through edges of the joined substrates with filler;

(6) applying heat to the joined substrates and bonding the joined substrates;

(7) removing a part of said first substrate down to said second substrate;

(8) forming an electrode on said second substrate where said first substrate has been removed; and (9) dividing the bonded substrates along at least a part of said grooves.

* * * * *